(12) United States Patent
Gruner et al.

(10) Patent No.: US 6,593,998 B2
(45) Date of Patent: Jul. 15, 2003

(54) PROJECTION EXPOSURE SYSTEM

(75) Inventors: Toralf Gruner, Oberkochen (DE);
Rudolf Von Bünau, Essingen (DE);
Erwin Gaber, Heidenheim (DE)

(73) Assignee: Carl Zeiss SMT AG (DE)

( * ) Notice: Subject to any disclaimer, the term of this patent is extended or adjusted under 35 U.S.C. 154(b) by 0 days.

(21) Appl. No.: 09/934,252

(22) Filed: Aug. 21, 2001

(65) Prior Publication Data

US 2002/0075466 A1 Jun. 20, 2002

(30) Foreign Application Priority Data

Aug. 22, 2000 (DE) .......................................... 100 40 998

(51) Int. Cl.[7] .......................... G03B 27/54; G03B 27/42; G02B 17/00
(52) U.S. Cl. ............................. 355/67; 355/53; 359/727
(58) Field of Search .................... 353/30, 52; 359/364, 359/796, 797, 808, 884, 727; 355/30, 53, 67

(56) References Cited

U.S. PATENT DOCUMENTS

| 4,278,330 A | * | 7/1981 | Buchroeder .................. 359/676 |
| 4,344,676 A | * | 8/1982 | Shafer ........................ 359/730 |
| 5,103,342 A | * | 4/1992 | Kataoka ...................... 359/674 |
| 5,454,021 A | * | 9/1995 | Nakajima et al. .............. 378/70 |
| 5,636,000 A | | 6/1997 | Ushida et al. ................ 355/30 |
| 5,805,273 A | * | 9/1998 | Unno .......................... 355/30 |
| 5,894,341 A | * | 4/1999 | Nishi et al. .................. 250/238 |
| 6,043,863 A | * | 3/2000 | Ikeda .......................... 355/53 |
| 6,377,338 B1 | * | 4/2002 | Suenaga ....................... 355/53 |
| 6,398,374 B1 | * | 6/2002 | Chapman et al. ........... 359/364 |
| 6,404,547 B1 | * | 6/2002 | Hull ........................... 359/365 |

FOREIGN PATENT DOCUMENTS

| EP | 0 964 307 A2 | 12/1999 |
| EP | 1 039 510 A1 | 9/2000 |
| JP | WO99/26278 | 5/1999 |

* cited by examiner

*Primary Examiner*—Russell Adams
*Assistant Examiner*—Andrew Sever
(74) *Attorney, Agent, or Firm*—Factor & Partners

(57) ABSTRACT

A projection exposure system for microlithography that has a catadioptric projection objective and a light source is claimed. The projection objective has at least one mirror and at least one lens that are composed of specified materials. Also the positions of the mirror and of the lens within the projection objective are also specified. The material and position are specified in such a way that imaging changes in the projection objective that are due to illumination-induced change in the reflecting surface of the mirror counteract illumination-induced imaging changes in the lens. Illumination-induced imaging changes in the entire projection objective are reduced in this way.

44 Claims, 3 Drawing Sheets

PROJECTION EXPOSURE SYSTEM

The invention relates to a projection exposure system, in particular for microlithography, comprising a catadioptric projection objective and a light source.

In such projection exposure systems, illumination-induced imaging errors occur that are due to the thermal deformation of the optical components present-in the projection objective. The thermal deformation results in this case from the heating of the optical components occurring as a result of the residual absorption of the projection light.

A further illumination-induced effect that results in the imaging errors is the refractive index change due to the illumination light in the transilluminated material of the optical components. Such refractive index change effects may occur reversibly, with the result that the refractive index of the optical components is the same after the irradiation as before, or they may also be irreversible.

Said illumination-induced imaging errors impair the imaging quality of the projection exposure system and cannot be accepted, in particular, at those points where the resolution of very fine structures is desired.

The object of the present invention is therefore to develop a projection exposure system of the type mentioned at the outset in such a way that illumination-induced imaging errors are reduced.

According to the invention this object is achieved in that
a) at least one mirror and at least one lens assigned to it of the projection objective are composed of materials chosen in such a way as a function of a given light intensity distribution in the projection objective and
b) the position of the mirror and the position of the lens are similar inside the projection objective in such a way
c) that the imaging changes in the projection objective that are due to an illumination-induced imaging change in the reflection surface of the mirror counteract illumination-induced imaging changes in the lenses.

The invention is based on the observation that changes in the radius of curvature of optical components, that is to say, for example, a reduction in the radius of curvature of a concave optical surface, have a different effect in the case of a reflecting surface on the optical imaging properties of said surface than in the case of a refracting surface.

In particular, a lens (or a lens group) and a mirror that are disposed in a similar position inside a projection objective and either both have a collecting or both have a divergent effect counteract one another because of the imaging changes with regard to their imaging properties that occur in them as a result of the illumination-induced heating. This results in the possibility of bringing about compensation for the illumination-induced imaging changes. "Similar position" is understood as meaning such a positional assignment of the reflecting surface with respect to the refracting surface, that is to say of the mirror with respect to the at least one lens that the subaperture ratios in the reflecting and in the refracting surface do not differ considerably. In this connection, the subaperture ratio is the ratio between the distance between diametrically opposite impingement points of peripheral rays that proceed from a field point, that is to say from a point in the object to be projected, on the optical surface and the unobstructed aperture of said optical surface inside the projection objective.

For a given lens design of a projection objective, a lens or a lens group whose subaperture ratio does not differ considerably from that of the mirror can as a rule be specified for a mirror inside the projection objective. A selection of the materials that can be supported by a calculation and from which the mirror and the lens or the lens group are to be made results in total in imaging properties of the projection objective that depend only to a small extent or not at all on illumination-induced changes in the imaging properties of the individual optical components.

In this connection, the material is selected so as to take account, for example, of the thermal conductivity, of the coefficient of thermal expansion and of the refractive index behaviour during a temperature change in the respective material. In addition, the refractive index behaviour of the respective material can be taken into account as a function of the illumination intensity.

Such compensating projection objectives are to a large extent independent of illumination-induced drift of the imaging properties of the individual components. This increases the achievable throughput of the projection exposure system.

Preferably, subaperture ratios of the mirror and of the lens differ at their respective positions inside the projection objective by less than 25%. This ensures that the imaging beams that are assigned to the individual object points are influenced in the same way by the assigned optical surfaces, with the result that as great a compensation as possible can take place of imaging errors that are illumination-induced in the individual components.

More than one lens may be assigned to the mirror. Owing to the optical conditions during reflection, dimensional changes in a reflecting surface result in greater imaging changes than identical dimensional changes in a refracting surface. It is therefore advantageous to use a plurality of lenses to compensate for the illumination-induced imaging changes in a mirror. Since, as a rule, the number of lenses in known catadioptric projection objectives is substantially greater than the number of reflecting surfaces, such an assignment can be carried out, as a rule, without fairly large changes to the optical design.

Preferably, precisely two or precisely three lenses are assigned to the mirror. In known designs of a projection objective, a lens group that comprises two individual lenses in one design and three individual lenses in another design is disposed inside a projection objective in such a way that it differs in its subaperture ratio only very slightly from that of the mirror.

Said lens group is therefore particularly well suited for compensating for illumination-induced imaging changes that are due to the heating of the mirror surface. In addition, the lens group in these known projection objectives is disposed directly adjacently to the mirror so that they can form a unified assembly with the latter. This simplifies the retrofitting of the known projection objectives with an optical assembly that compensates in the above sense.

The lens may have a lens body composed of $CaF_2$. Calculations have shown that the use of lenses composed of said lens material together with conventional materials that are used for mirrors in catadioptric projection objectives result in a good compensation for imaging errors.

The mirror may have a mirror base composed of one of the glass materials BK3, BK6 or BK7. These materials are robust, can readily be machined and have thermal properties that make them appear well suited for use as a compensating element.

Alternatively, the mirror base may be constructed of the glass material SK1. The coefficient of thermal expansion of SK1 is between BK3 and BK7, with the result that this material recommends itself for certain applications.

In a further alternative embodiment, the mirror may have a mirror base composed of one of the glass materials FK51 or FK54. These materials have relatively high coefficients of thermal expansion compared with the abovementioned glasses and therefore offer the potential of a large optical compensation effect for illumination-induced imaging errors at least of a mirror.

Alternatively, the mirror may have a glass support composed of the transparent glass ceramic material marketed under the trademark name Zerodur®. Zerodur® is a glass that has an extremely low coefficient of thermal expansion since it is composed of crystalline and amorphous constituents. Illumination-induced effects that result from the heating of Zerodur® are therefore very small. In the case of such a Zerodur® mirror, the illumination-induced imaging changes are therefore small and provide, for example, the possibility of undertaking a compensation with only one individual lens.

Depending on the production process, a low coefficient of thermal expansion can be achieved in the case of Zerodur® with positive or negative sign. In the case of negative coefficient of thermal expansion, the imaging change base on an illumination-induced dimensional change in a mirror composed of this material operates additively with respect to the illumination-induced change in the imaging properties based on a dimensional change in an assigned lens. This material is therefore suitable for use in cases in which changes in the imaging properties result in an overcompensation of the illumination-induced dimensional change in the lens owing to an illumination-induced refractive index change in the lens material. In the case of the lens, this results in a net effect of the illumination-induced imaging change that counteracts the illumination induced imaging change in the mirror.

Finally, the mirror may alternatively have a mirror base composed of monocrystalline silicon. This material also has a low coefficient of thermal expansion compared with the glasses. This again results in only very small illumination-induced imaging changes in the mirror.

The projection exposure system can be operated with a conventional illumination setting. Such an illumination setting, that is to say a "homogeneous filling" with projection light in a pupillary plane of the projection objective, results, as a rule, in a heating of the optical components of the projection objective, which is greater in the center of the illuminated surface than at the periphery. This reduces the radius of curvature of convex optical surfaces involved and increases the radius of curvature of concave optical surfaces involved. Calculations have shown that such changes in the radius of curvature can readily be compensated for by a combination of a mirror and a lens or lens group assigned to it within the projection objective.

Alternatively, a coherent illumination setting may be used. Such an illumination setting corresponds to a "homogeneous filling" with illumination light only in a central region of a pupillary plane of the projection objective. The change in the radii of curvature of the optical surfaces involved is therefore restricted to said central region. In other respects, however, similar conditions arise as in the case of the conventional illumination setting, with the result that a good compensation is also possible.

A third illumination setting that can be used is an annular illumination setting. This is characterized by an "annular filling" in a pupillary plane of the projection objective, in which a central region is not illuminated. In an annular region around the optical axis of the optical-surfaces, this results in a reduction in the radius of curvature in the case of convex surfaces and an increase in the radius of curvature in the case of concave surfaces. Here, again, calculations show that illumination-induced imaging changes that are due to a mirror can readily be compensated for by an assigned lens or lense group.

A heating device for the mirror and/or the lens can be provided to additionally compensate for the illumination-induced imaging changes. Such a heating device can generate a compensating shaping of an optical surface within the projection objective that further improves the compensation for the illumination-induced imaging changes. All in all, such a projection objective can be manufactured in such a way that it is substantially neutral in its imaging properties, that is to say independent of the projection illumination.

The heating device may comprise a light-absorbing coating of the mirror and/or of the lens. In this case, the illumination light itself provides for the additional compensating action described in that a specified heating and, consequently, a specified deformation of the coated optical components takes place as a result of an absorption extending beyond the unavoidable residual absorption. The deformation can be influenced by the thickness, the specific absorption coefficient and the position of the coating on the respective optical surface.

Alternatively or additionally, the heating device may comprise at least one active heating element that is disposed at the circumference of the lens and/or of the mirror. In this way, an additional, controlled heating input can take place into the lens or mirror body that results in a defined dimensional change. This can be used for additionally compensating for illumination-induced imaging changes.

The heating device may comprise at least one active heating element that is disposed behind the reflection surface of the mirror at the mirror base. In this way, the central region of a reflecting surface can also be heated if this is desirable for compensation purposes.

Alternatively or additionally, a cooling device for the mirror and/or the lens may also be provided to additionally compensate for the illumination-induced imaging changes. In principle, the same applies to the effect of the cooling device as already explained above in relation to the heating device. A defined dimensional change in the optical surfaces that can be used to compensate additionally for illumination-induced imaging changes can also be achieved by cooling.

The cooling device may have at least one thermal contact surface for dissipating the illumination-induced heating of the mirror and/or the lens. Such a thermal contact surface may be disposed either in the region of the circumferential surface or, in the case of a mirror, also behind the reflection surface of the mirror on the mirror base. The heat dissipation achieves a passive cooling of those regions of the optical components adjacent to the thermal contact surface. This can also be used to compensate for the illumination-induced imaging changes.

Analogously to the heating device, the cooling device may also comprise at least one cooling element that is disposed in a first embodiment at the circumference of the lens and/or of the mirror and in a second embodiment, alternatively or additionally, behind the reflection surface of the mirror at the mirror base. Here the same applies as was explained above for the analogously designed heating device.

Exemplary embodiments of the invention are explained in greater detail below by reference to the drawing; in the drawing.

Figure 1:
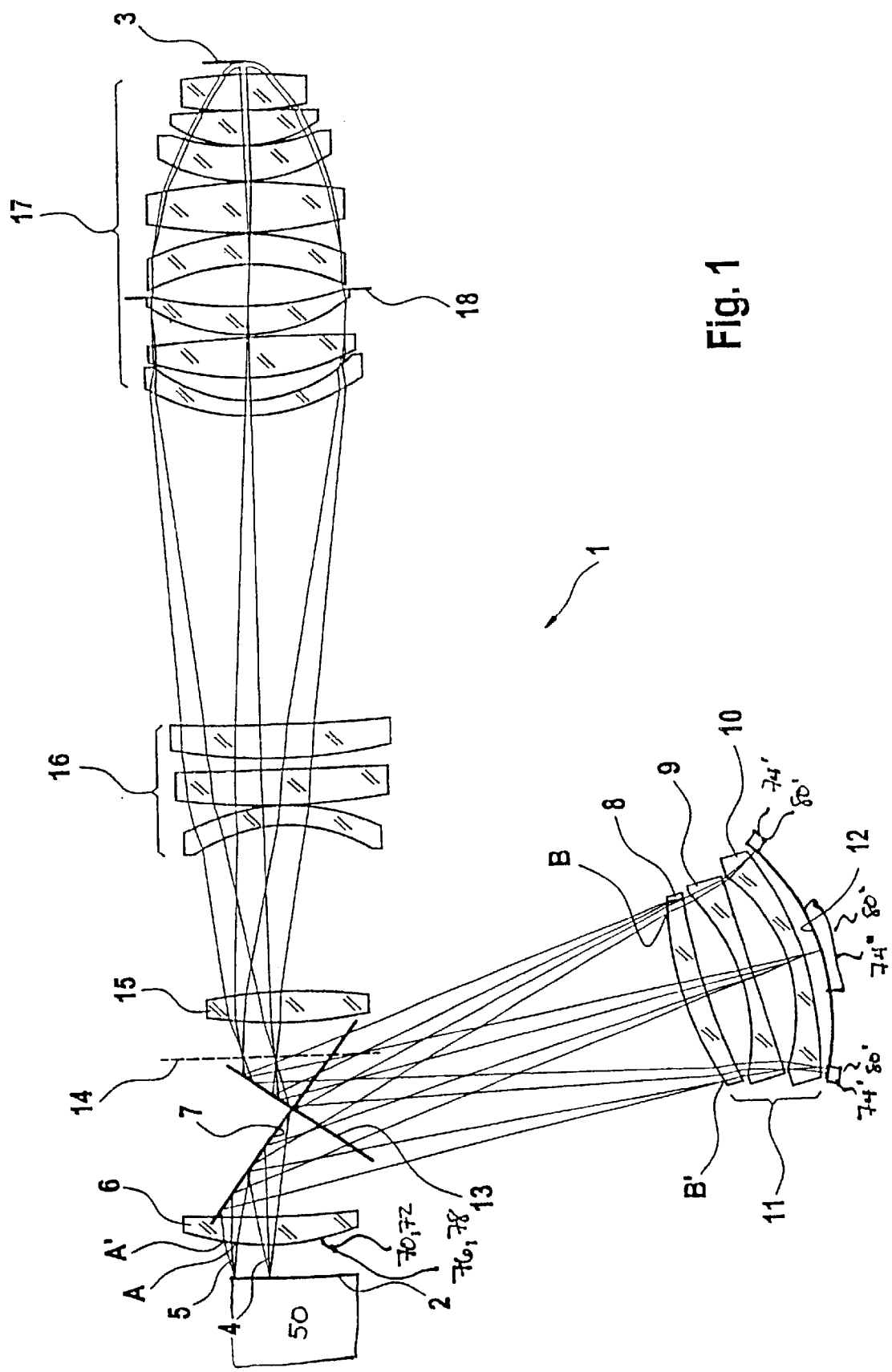
FIG. 1 shows a catadioptric projection objective for microlithography.

The projection objective shown in FIG. 1 in meridian section and provided as a whole with the reference symbol 1 forms a reduced image of a structure situated on a reticle 2 on a wafer 3. For the purpose of illustration, the ray paths are shown of two beams 4, 5, which originate from two field points in the plane of the reticle 2, through the projection objective 1. The beams 4, 5 are light, transmitted by the reticle 2, of a projection light source, for example an ArF excimer laser having a wavelength of 193.3 nm, which is not shown in the drawing.

The structure of the projection objective 1 is now explained on the basis of the passage of the beams 4, 5 through it:

The beams 4, 5 originating from the reticle 2 first pass through a lens 6 that is adjacent to the reticle 2 and has positive refractive power. The peripheral rays of the beam 5 enter through the entry surface of the lens 6 at points A, A'. The distance between the points A and A' is small compared with the unobstructed aperture of the lens 6.

The beams 4, 5 are then reflected by a plane mirror surface 7 in the plane of the drawing at an obtuse angle in the direction of a lens group 11 comprising three individual lenses 8, 9, 10. The peripheral rays of the beam 5 pass through the entry surface of the lens 8 at the points B, B'. The distance between the points B, B' is in this case approximately equal to the unobstructed aperture of the lenses 8, 9, 10.

The ratio between the distance A, A' or B, B', respectively, that is to say the distance between the points of impingement of the peripheral rays that proceed from a field point of the reticle 2 on an optical component and the unobstructed aperture of said optical component is referred to below as the subaperture ratio.

After a first passage through the lens group 11, the beams 4, 5 impinge on a concave mirror 12. The latter has a reflection layer that is supported by a base body, which is not shown. The refractive power of the lens 6 and of the lens group 11 is such that the concave mirror 12 is situated in a pupillary plane of the projection objective 1. The subaperture ratio in the case of the lenses 8, 9, 10 of the lens group 11 and in the case of the concave mirror 12 is approximately equal to 1 since said optical components are situated in or in the vicinity of a pupillary plane. The beam 4, 5 belonging to a field point therefore virtually occupies the entire unobstructed aperture of said optical components.

After reflection at the concave mirror 12, the beams 4, 5 pass through the lens group 11 in a second passage. The beams 4, 5 that return after reflection at the concave mirror 12 in the vicinity of the mirror surface 7 are reflected by a further mirror surface 13 through an acute angle in the plane of the drawing.

In the ray path downstream of the mirror surface 13, the projection objective 1 has an intermediate image plane 14 adjacent to it. Downstream of the intermediate image plane 14, the beams 4, 5 pass through a single lens 15 and two further groups of lenses 16, 17, whose detailed structure is not of further interest here. In the lens group 17, the beams 4, 5 pass through a further pupillary plane 18. The lens group 17 images the beams 4, 5 on the wafer 3.

Figure 2:
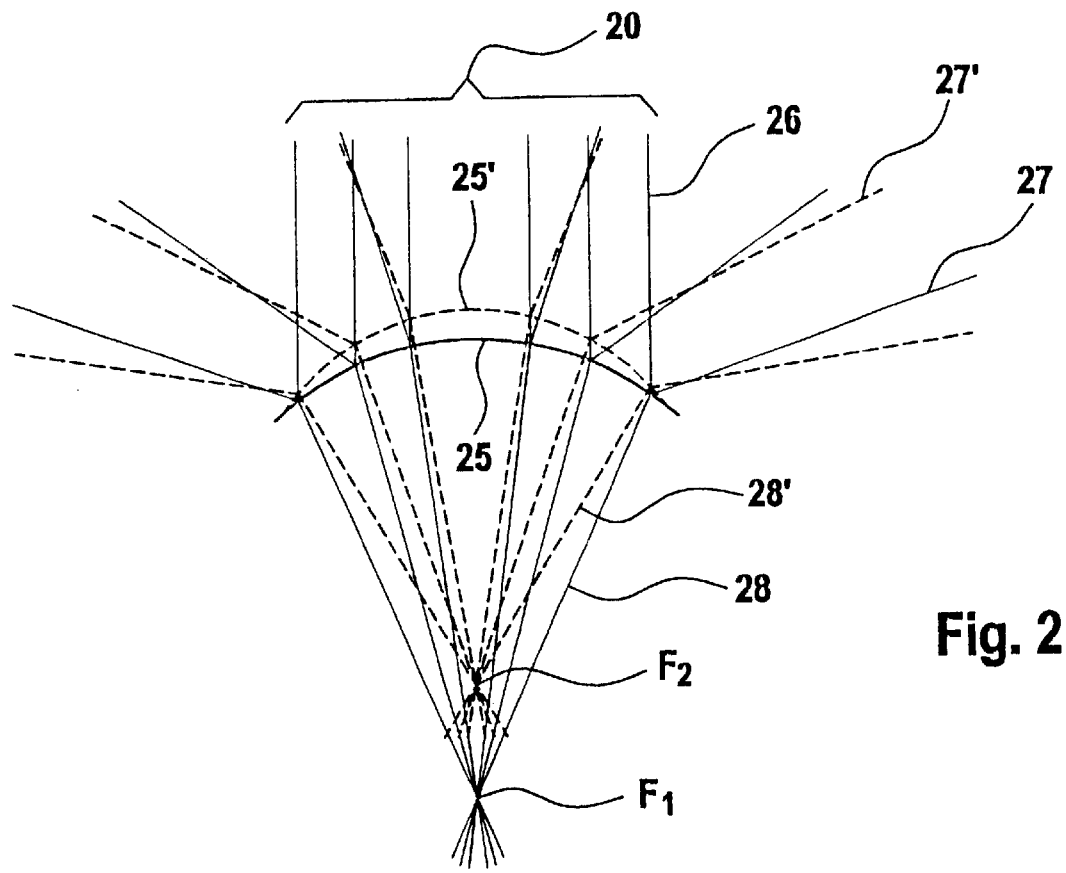
FIG. 2 shows refraction and reflection conditions, respectively, at a convex spherical surface whose radius of curvature decreases as a result of an illumination-induced heating.

The imaging conditions in the case of a convex refracting or reflecting surface that is heated as a consequence of the residual absorption occurring during the illumination and, consequently, expands are shown in FIG. 2. Such residual absorptions can take place, for example, in the lens body, in the region of a reflection layer, carried by a base body, of a mirror or in its base body itself.

Figure 3:
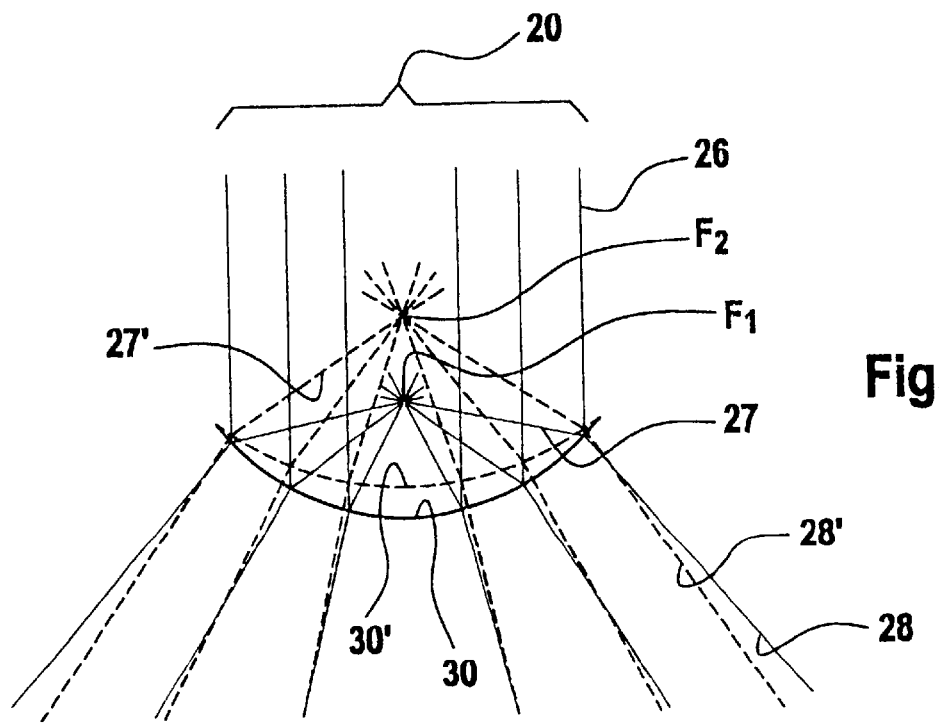
FIG. 3 shows refractive and reflection conditions at a concave spherical surface, respectively, whose radius of curvature increases as a result of an illumination-induced heating.

In the description of the imaging conditions of FIGS. 2 and 3, which each show meridian sections of a reflecting or refracting surface, aperture aberrations are neglected. In addition, the change occurring during heating in the radius of curvature of the optical surface is considerably exaggerated compared with the real case.

In FIG. 2, the illumination beam 20, of which six individual rays 26 are shown in FIG. 2, impinges from above on a convexly curved reflecting or refracting surface 25. It is initially assumed below that the surface 25 is a reflecting surface. In that case, the six individual rays 26 are reflected by the surface 25 in such a way that the illuminating beam is scattered. The individual rays reflected by the surface 25 and shown as continuous lines are denoted by the reference symbol 27. The reflecting surface 25 therefore acts as a divergent mirror with a specified negative focal length.

If the reflecting surface 25 is heated owing to residual absorption of an incident illumination beam 20, the central surface region of the surface 25, which reflects the core of the illumination beam 20, is heated most strongly since the heat cannot be dissipated at this point in a lateral direction, that is to say transversely with respect to the ray path. The result is that the base body (not shown) of the surface 25 expands most extensively in this central surface region in the direction of the optical axis of the optical component to which the surface 25 belongs. All in all, this results in a surface 25' whose radius of curvature is less than that of the "cold" surface 25. The heated surface 25' is shown in FIG. 2 by a broken line.

This smaller radius of curvature has the result that the individual rays 27' reflected by the heated surface 25', which are shown in FIG. 2 as broken lines, are more strongly scattered at the heated surface 25' than is the case for the cold surface 25. All in all, the heated surface 25 therefore acts as a more strongly divergent mirror than the cold surface 25.

In addition, FIG. 2 shows the circumstances in the case of light refraction at the surface 25. In this case, it is assumed that the individual rays 26 enter an optically denser medium on passing through the surface 25. The convex refracting surface 25 consequently acts as a converging surface that focuses individual rays 28, shown in the "cold state" as continuous lines, of the illumination beam 20 at a focus $F_1$.

As already explained above, the heated surface 25' has a smaller radius of curvature than the cold surface 25. The refractive power of the heated surface 25' is therefore greater than that of the cold surface 25, with the result that the individual rays 28' (shown as broken lines) refracted at the heated surface 25' combine at a focus $F_2$ whose distance from the entry surface is less than the distance of the focus $F_1$ from the entry surface. The heated refracting surface 25' is therefore a converging surface of shorter focal length than the cold surface 25.

FIG. 3 shows, in a diagram analogous to FIG. 2, the imaging circumstances in the case of a concavely curved reflecting or refracting surface 30.

Assuming that the surface 30 acts as a reflecting surface, that is to say in the case of the mirror 12 of FIG. 1, the incident individual rays 26 of the illumination beam 20 are reflected as individual rays 27 and combine at a focus $F_1$.

The irradiation of the surface 30 with the incident illumination beam 20 results in heating due to residual absorption. This results, analogously to the comments made in connection with FIG. 2, in a raising of the surface 30, which is most extensive in the central region of the surface 30. The heated surface is denoted by 30'. It has a greater radius of curvature than the unheated surface 30.

This has the result that individual rays 27' reflected by the heated surface 30' converge in a focus $F_2$ that is at a greater distance from the converging surface than the focus $F_1$ is from the cold surface 30. The concave surface 30' therefore acts as a converging mirror having a greater focal length as a result of the heating.

Analogously to FIG. 2, the action of a heated concave refracting surface 30 is likewise shown in FIG. 3. Here, again, the "cold" refracted individual rays are denoted by 28 and the "hot" refracted individual rays by 28'. As a result of the increase in the radius of curvature, the surface 30 acts on heating as a more weakly diverging lens compared with the divergent effect in the cold state.

A combination of a refracting convex surface 25 (cf. FIG. 2) and a reflecting concave surface 30 (cf. FIG. 3) which are traversed consecutively by the ray path behaves as follows on heating:

In the cold state, the refracting surface 25 and the reflecting surface 30 each have a converging effect specified by a focal length. As shown above, the converging effect of the surface 25 increases on heating and the converging effect of the mirror 30 decreases on heating. It is therefore possible to achieve an imaging behaviour in which the imaging changes due to the heating precisely balance as a result of suitable selection of the materials of the base of the refracting surface 25, that is to say of a lens body, and of the base body for the mirror surface 30 and as a result of a suitable specification of the initial focal lengths of the surfaces 25 and 30, of the spacing of these two optical components and further parameters (see below).

In the case of the projection objective 1, which was described in connection with FIG. 1, the three lenses 8, 9, 10 of the lens group 11 serve as optical compensating elements for the heating behaviour of the mirror 12.

In this connection, the concave mirror 12 has a reflection coating that has been applied to a mirror base composed of the glass material BK7. Alternatively, the mirror base may be manufactured from the transparent glass ceramic material marketed under the trademark name Zerodur®. The lenses 8, 9, 10 are composed of calcium fluoride ($CaF_2$).

The residual absorptions in the lens bodies or in the reflection coating of the concave mirror 12, respectively, are in the per-thousand range at the wavelength of 193.3 nm.

In the case of a typical heating of the lenses 8, 9, 10 and of the concave mirror 12 by the illumination beam 20, the following changes in the Zernike coefficients of the wave front deformation (in nm) were calculated for different illumination settings. This calculation was made assuming an illumination wavelength of 157 nm. The results are shown in the table below:

| Zernike coefficient of wave front deformation (in nm) | Conventional setting | | Annular setting | | Coherent setting | |
| --- | --- | --- | --- | --- | --- | --- |
| | Mirror 12 | Lenses 8–10 | Mirror 12 | Lenses 8–10 | Mirror 12 | Lenses 8–10 |
| Z4 | −35.5 | 22.4 | −27.5 | 7.2 | −33.5 | 7.2 |
| Z9 | 3.1 | −5.7 | −3.7 | 3.2 | −5.5 | 5.1 |
| Z17 | 1.4 | −2.2 | −1.1 | 1.8 | 6.6 | −10.0 |

Various aberrations can be assigned to the Zernike coefficient of wave front deformation. A value of Z4 varying in a certain form across the field corresponds to a field curvature. A constant value of Z4 corresponds to defocusing. Z17 corresponds to a quadruple-ripple structure.

Figure 4:
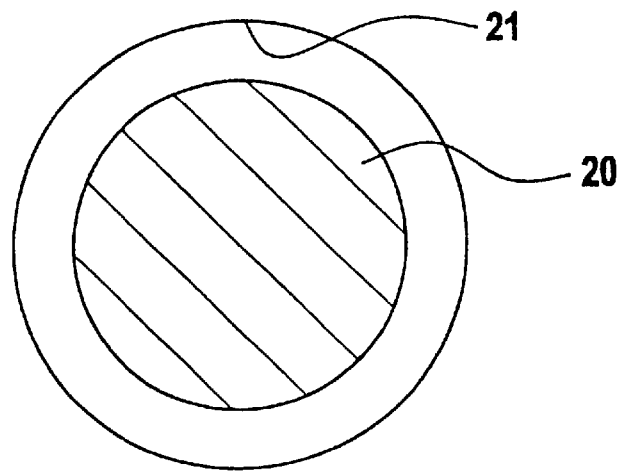
FIGS. 4 to 6 show alternative illumination settings for the projection objective of FIG. 1.
Figure 5:
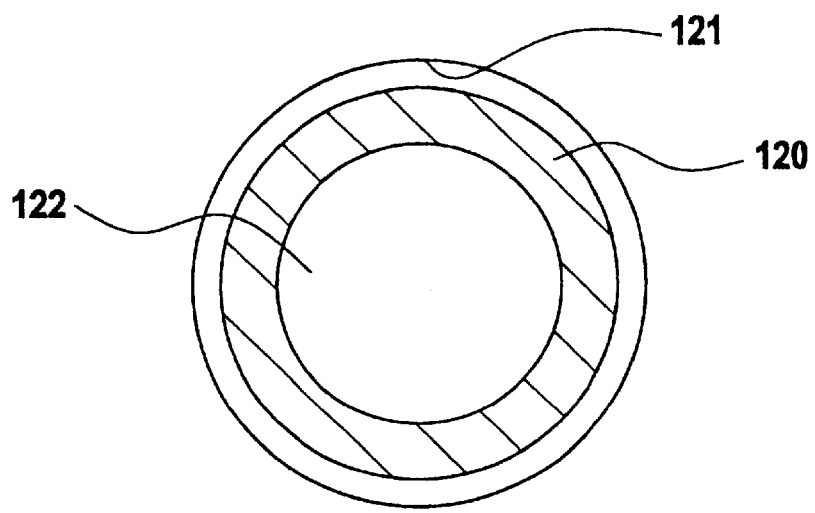
Figure 6:
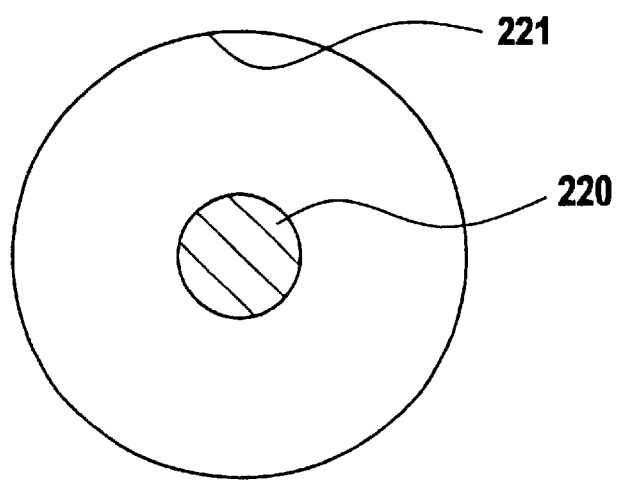

The illumination settings listed in the table denote various projection light distributions in the pupillary plane that can be produced, for example, by a suitable diaphragm in a pupillary plane in illumination optics, situated in the ray path upstream of the reticle 2, for the light source of the projection exposure system (not shown). Three examples of such illumination settings are shown in FIGS. 4 to 6. Each of these shows a diagrammatic section perpendicular to the optical axis of the projection exposure system 1 in a pupillary plane.

FIG. 4 shows a so-called conventional illumination setting, in which a homogeneous illumination beam 20 has a cross section with a circular boundary in the pupillary plane shown. The illumination beam 20 is in this case situated coaxially in the unobstructed aperture 21 of the optics of the projection objective 1 in such a way that the ratio between the numerical aperture of the illumination beam 20 and the numerical aperture set by the unobstructed aperture 21 of the optics of the projection objective 1 is approximately 0.5.

In the case of the so-called annular illumination setting shown in FIG. 5, an illumination beam 120 is annular in the pupillary plane shown, with the result that there is a central unilluminated middle region 122 in the pupillary plane. The ratio of the numerical aperture of the illumination set by the outer periphery of the illumination beam 120 and of the numerical aperture set by the unobstructed aperture 121 of the optics of the projection objective 1 is typically between 0.5 and 0.8 in this illumination setting.

In the so-called coherent illumination setting shown in FIG. 6, there is also a homogeneous illumination beam 220 that has a cross section with a circular boundary. In relation to the unobstructed aperture 221 of the optics of the projection objective, the illumination beam 20 has, however, a substantially smaller diameter than the illumination beam 20 of FIG. 4, with the result that, in the case of the coherent illumination setting of FIG. 6, the above-described ratio of the numerical apertures is typically 0.3.

From the table it is evident that the changes in wave front deformation due to the mirror can be at least-partly compensated for by the changes effected by the lenses 8 to 10. The changes effected by the mirror and by the lenses always have opposite sign, with the result that the absolute amount of the imaging change in the entire system of mirrors and lenses is always less than the absolute value of the maximum individual amount.

The changes in the Zernike coefficient were calculated as follows: a position-dependent illumination angle distribution for the illumination of each individual optical component (8, 9, 10, 12) to be considered was first determined on the basis of the illumination setting specified in each case and from the diffraction characteristic. The radiation energy distributions over the individual optical components (8, 9, 10, 12) were then calculated. From this, the radiation energy absorbed in the individual optical components (8, 9, 10, 12) were determined. The temperature distribution and the material deformation of the individual optical components (8, 9, 10, 12) were then calculated using a finite-element method. From this, the aberration contributions, i.e. the changes in the Zernike coefficients) were calculated on the basis of the thermally induced refractive-index changes and of the material deformation for each of the individual optical components (8, 9, 10, 12).

The combination of a reflecting convex surface 25 (cf. FIG. 2) and of a refracting concave surface 30 (cf. FIG. 3) that are passed through consecutively by the ray path also has an analogous effect. The reflecting convex surface 25 scatters more extensively on heating, as explained in connection with FIG. 2. This can be specified by a decrease in the contribution of the focal length of the reflecting surface 25, for example from f=−100 mm to f=−99 mm. Simultaneously, the heating of a concave refracting surface 30 has the result that its divergent effect becomes weaker. This could result, for example, in a focal length change from f=−100 mm to f=−101 mm. Here, again, it is evident that, on the basis of the oppositely acting changes in the focal lengths of such a combination of optical surfaces, a combination of associated optical components can be specified whose optical overall imaging conditions are independent of an illumination-induced change in the optical properties of an individual component.

The reason for a change in the refractive power of a lens may be not only thermal expansion, as explained above, but also a change in the refractive index. This can reinforce the expansion effect described or counteract it. Ultimately, a resultant effect is left, that is to say an increase in the case of a convex lens surface or, if the refractive index effect is opposite in sign and the expansion effect is predominant, even a decrease in the refractive power on heating. Depending on the magnitude and direction of the effect, however, a combination of such a lens with a mirror having a mirror base composed of a material having a positive or a negative coefficient of thermal expansion in which the imaging changes precisely cancel one another out is always possible in accordance with the comments above.

In addition to BK7, the following further materials can be used, for example, for the mirror base:

| Material | Coefficient of thermal expansion ($\alpha$ in $\mu$m/[m K]) |
|---|---|
| Zerodur | −0.1 to 0.1 |
| Silicon | 0.5 |
| BK3 | 6.1 |
| SK1 | 7.1 |
| BK7 | 8.3 |
| BK6 | 9.1 |
| FK51 | 15.3 |
| FK54 | 16.5 |

In addition, other materials having similar thermal behaviour, for example special carbon compounds, may also serve as mirror-base materials.

Directly adjacent components do not necessarily have to serve as optical components behaving in a compensating manner in the way described above. It is sufficient for the compensating effect if the optical components are situated at positions at which they do not have unduly strongly differing subaperture ratios. Calculations have shown that a difference in the subaperture ratio of 25% still results in a good compensating action.

In the projection objective 1 of FIG. 1, for example, the optical components 8 to 12 and the optical components of the lens group 17, which are all situated in the vicinity of a pupillary plane of the projection objective 1, all have a subaperture ratio close to 1. These components are consequently positioned in an optically equivalent way and may be used as compensating elements. It is therefore possible, for example, to compensate for optical heating effects that occur in the case of the mirror 12 by means of one or all the lenses of the lens group 17.

In addition, and as shown in FIG. 1, the illumination-induced heating of the optical components assigned to one another may furthermore be influenced by other parameters. As examples of this, mention may be made of an additional controlled heating of optical components or regions of the latter by using heating device 70. Heating device 70 can comprise a number of devices/elements for controlling the temperature of lenses and/or mirrors, including applying a light absorptive coating 72 to lenses/mirrors that absorbs projection light that is not needed, or associating at least one active heating element 74 with the lens/mirror, either circumferentially 74' or behind 74" the reflecting surface of a mirror. Additionally, mention may also be made of a controlled cooling of optical components or a controlled passive heat dissipation. Either can be implemented using cooling device 76, which may comprise thermal contact surface 78 associated with lenses/mirrors for the passive dissipation of heat, or active cooling element 80, associated at the circumference 80' of lenses, or mirrors, or behind 80" the reflecting surface of a mirror.

Heating, cooling or heat-dissipation elements that are coupled to a reflecting surface may be disposed both in the circumferential region of the surface and behind the reflecting surface, that is to say at that side of the reflecting surface situated opposite the irradiated side.

Heating, cooling or heat-dissipation elements are coupled, as a rule, in the case of transmissive elements in the circumferential region in order to avoid projection light losses.

A thermally induced residual effect on the optical imaging properties that still remains after the above-described effect of the illumination-induced dimensional changes of lenses and mirrors can be fully compensated for by these compensation parameters.

What is claimed is:

1. A projection exposure system having a catadioptric projection objective and a light source, the system comprising:
    at least one mirror and at least one lens associated with the at least one mirror, wherein the at least one mirror has a first position and the at least one lens has a second position, and are both composed of materials chosen as a function of a given light intensity distribution in the catadioptric projection objective,
    such that the imaging changes in a catadioptric projection objective which are due to an illumination-induced imaging change in the at least one mirror counteract illumination-induced imaging changes in the at least one lens.

2. The system of claim 1, wherein the first position and the second position result in the at least one lens and the at least one mirror each comprising a subaperture ratio, wherein the first position and the second position are located such that the subaperture ratio of each of the at least one mirror and at least one lens differ by less than 25%.

3. The system of claim 1, wherein the at least one lens comprises a plurality of lenses.

4. The system of claim 3, wherein the at least one lens comprises three lenses.

5. The system of claim 1, wherein the at least one mirror and the at least one lens define a group of optical components, wherein the at least one lens is selected and disposed such that the imaging changes of the at least one lens of the group of optical components compensate for the imaging changes of the at least one mirror of the group of optical components.

6. The system of claim 1, wherein the at least one lens comprises $CaF_2$.

7. The system of claim 1, wherein the at least one mirror comprises one of the group consisting of: BK3, BK6 or BK7.

8. The system of claim 1, wherein the at least one mirror comprises SK1.

9. The system of claim 1, wherein the at least one mirror comprises at least one of the group consisting of: FK51 and FK54.

10. The system of claim 1, wherein the at least one mirror comprises Zerodur.

11. The system of claim 1, wherein the at least one mirror comprises monocrystalline silicon.

12. The system of claim 1, further comprising a conventional illumination setting.

13. The system of claim 1, further comprising a coherent illumination setting.

14. The system of claim 1, further comprising an annular illumination setting.

15. The system of claim 1, further comprising a heating device associated with at least one of the at least one mirror and the at least one lens, to, in turn, further compensate for illumination-induced imaging changes.

16. The system of claim 15, wherein the heating device comprises a light-absorbing coating associated with at least one of the at least one mirror and at least one lens.

17. The system of claim 15, wherein the heating device comprises at least one active heating element, the at least one active heating element being disposed at the circumference of at least one of the at least one mirror and at least one lens.

18. The system of claim 15, wherein the heating device comprises at least one active heating element, the at least one active heating element being disposed behind the at least one mirror.

19. The system of claim 1, further comprising a cooling device associated with at least one of the at least one mirror and the at least one lens, to, in turn, further compensate for illumination-induced imaging changes.

20. The system of claim 19, wherein the cooling device comprises at least one thermal contact surface, the at least one thermal contact surface associated with at least one of the at least one mirror and at least one lens.

21. The system of claim 19, wherein the cooling device comprises at least one active cooling element being disposed at the circumference of at least one of the at least one mirror and at least one lens.

22. The system of claim 19, wherein the cooling device comprises at least one active cooling element being disposed behind the at least one mirror.

23. A method for preventing illumination-induced imaging errors within a projection exposure system for a projection exposure system used in microlithography, the projection exposure system comprising a catadioptric projection objective and a light source, characterized in that the projection objective comprises at least one mirror and at least one lens associated with the at least one mirror; wherein the method comprises the steps of:
   a) selecting materials for the at least one mirror and the at least one lens as a function of a given light intensity distribution in the projection objective; and
   b) positioning the mirror and the lens inside the projection objective
   wherein the steps of selecting and positioning together result in a projection exposure system in which the imaging changes in the projection objective that are due to an illumination-induced imaging change in the reflection surface of the mirror counteract illumination-induced imaging changes in the lenses.

24. The method according to claim 23, wherein the step of positioning results in the at least one lens and at least one mirror each comprising a subaperture ratio, the subaperture ratio of the at least one mirror and of the at least one lens differ at their respective positions by less than 25%.

25. The method according to claim 23, wherein the at least one lens comprises a plurality of lenses.

26. The method according to claim 25, wherein the at least one lens comprises three lenses.

27. The method according to claim 23, wherein the at least one mirror and the at least one lens define a group of optical components, wherein the step of selecting and the step of positioning comprise the steps of selecting and disposing the at least one lens within the group in such a way that the imaging changes of the at least one lens within the group compensate for the imaging changes of the at least one mirror.

28. The method according to claim 23, wherein the step of selecting comprises selecting a lens comprising $CaF_2$.

29. The method according to claim 23, wherein the step of selecting comprises selecting a mirror comprising one of the glass materials BK3, BK6 or BK7.

30. The method according to claim 23, wherein the step of selecting comprises selecting a mirror comprising the glass material SK1.

31. The method according to claim 23, wherein the step of selecting comprises selecting a mirror comprising one of the glass materials FK51 or FK54.

32. The method according to claim 23, wherein the step of selecting comprises selecting a mirror comprising the glass material Zerodur®.

33. The method according to claim 23, wherein the step of selecting comprises selecting a mirror comprising monocrystalline silicon.

34. The method according to claim 23, further comprising a conventional illumination setting.

35. The method according to claim 23, further comprising a coherent illumination setting.

36. The method according to claim 23, further comprising an annular illumination setting.

37. The method according to claim 33, further comprising the step of associating a heating device with at least one of the at least one mirror and the at least one lens to, in turn, further compensate for illumination-induced imaging changes.

38. The method according to claim 32, wherein the heating device comprises a light-absorbing coating associated with at least one of the at least one mirror and of the at least one lens.

39. The method according to claim 32, wherein the heating device comprises at least one active heating element that is disposed at the circumference of at least one of the at least one lens and of the at least one mirror.

40. The method according to claim 32, wherein the heating device comprises at least one active heating element that is disposed behind the at least one mirror.

41. The method according to claim 23, further comprising the step of associating a cooling device with at least one of the at least one mirror and the at least one lens to, in turn, further compensate for illumination-induced imaging changes.

42. The method according to claim 41, wherein the cooling device comprises at least one thermal contact surface, the at least one contact surface associated with at least one of the at least one mirror and of the at least one lens.

43. The method according to claim 41, wherein the cooling device comprises at least one active cooling element that is disposed at the circumference of at least one of the at least one lens and the at least one mirror.

44. The method according to claim 41, wherein the cooling device comprises at least one active cooling element that is disposed behind the at least one mirror.

* * * * *